United States Patent [19]
Kowshik et al.

[11] Patent Number: 5,796,656
[45] Date of Patent: Aug. 18, 1998

[54] ROW DECODER CIRCUIT FOR PMOS NON-VOLATILE MEMORY CELL WHICH USES ELECTRON TUNNELING FOR PROGRAMMING AND ERASING

[75] Inventors: Vikram Kowshik, San Jose; Andy Teng-Feng Yu, Palo Alto; Jayson Giai Trinh, Milpitas, all of Calif.

[73] Assignee: Programmable Microelectronics Corporation, San Jose, Calif.

[21] Appl. No.: 803,806

[22] Filed: Feb. 22, 1997

[51] Int. Cl.⁶ .................................. G11C 11/34
[52] U.S. Cl. .................. 365/185.23; 365/185.18; 365/230.06
[58] Field of Search ............ 365/185.23, 185.18, 365/185.05, 230.06

[56] References Cited

U.S. PATENT DOCUMENTS

| | | | |
|---|---|---|---|
| 4,977,543 | 12/1990 | Kouzi | 365/218 |
| 5,265,052 | 11/1993 | D'Arrigo et al. | 365/189.09 |
| 5,365,479 | 11/1994 | Hoang et al. | 365/189.09 |
| 5,513,146 | 4/1996 | Atsumi et al. | 365/185.23 |
| 5,513,147 | 4/1996 | Prickett, Jr. | 365/230.06 |

*Primary Examiner*—David C. Nelms
*Assistant Examiner*—Hien Nguyen
*Attorney, Agent, or Firm*—Flehr Hohbach Test Albritton & Herbert LLP; William L. Paradice, III

[57] ABSTRACT

A row decoder circuit selectively provides suitable programming, reading, and erasing voltages to an associated memory array employing PMOS floating gate transistors as memory cells. In some embodiments, during programming, the row decoder circuit pulls a selected word line of the associated memory array high to a programming voltage on a first voltage line and maintains an un-selected word line at a predetermined potential. During reading, the row decoder circuit discharges the word line, if selected, to ground potential, and maintains the word line, if un-selected, at a predetermined potential. During erasing, the row decoder circuit charges the word line to a high negative voltage. The row decoder circuit includes isolation means to electrically isolate the word line of the associated memory array from undesirable potentials during programming, reading, and erasing operations.

13 Claims, 5 Drawing Sheets

5,796,656

ROW DECODER CIRCUIT FOR PMOS NON-VOLATILE MEMORY CELL WHICH USES ELECTRON TUNNELING FOR PROGRAMMING AND ERASING

CROSS-REFERENCE TO RELATED APPLICATIONS

This application is related to commonly owned U.S. patent application Ser. No. 08/557,589 entitled "A PMOS MEMORY CELL WITH HOT ELECTRON INJECTION PROGRAMMING AND TUNNELING ERASING", filed Nov. 14, 1995 and bearing attorney docket No. M-3546 US, to commonly owned U.S. patent application Ser. No. 08/722,429 entitled "SWITCHING CIRCUIT FOR CONTROLLED TRANSITION BETWEEN HIGH PROGRAM AND ERASE VOLTAGES AND POWER SUPPLY VOLTAGE FOR MEMORY CELLS", filed Oct. 3, 1996 and bearing attorney docket No. M-4099 US, to commonly owned U.S. patent application Ser. No. 08/738,434 entitled "ROW DECODER CIRCUIT FOR PMOS NON-VOLATILE MEMORY CELL WHICH USES CHANNEL HOT ELECTRONS FOR PROGRAMMING", filed Oct. 24, 1996 and bearing attorney docket No. M-4191 US, and to commonly owned U.S. patent application Ser. No. 08/639,280 entitled "CHARGE PUMP", filed Apr. 25, 1996 and bearing attorney docket No. M-3781 US.

BACKGROUND

1. Field of the Invention

This application relates to selectively providing programming, erasing, and reading voltages to a memory array containing PMOS floating gate memory cells.

2. Description of Related Art

Row decoder circuits are well known in the art and are used to select which row of memory cells within an associated memory array are to be programmed, erased, and/or read. Conventional row decoder circuits are intended to operate with memory arrays which employ as memory cells NMOS floating gate devices, i.e., NMOS EEPROM and NMOS flash memory cells. During read operations, these row decoder circuits charge selected word lines of the memory array to a predetermined positive potential while other circuitry (e.g., column decoders) charge the selected bit lines to a constant positive potential. Sense amplifiers connected to these selected bit lines monitor the voltage levels thereon to determine whether the selected memory cells are in a programmed or erased state. During such read operations, row decoder circuits maintain the un-selected word lines at ground potential. During programming operations, these row decoder circuits charge the selected word lines to a high voltage and maintain the un-selected word lines at a low voltage. During erase operations, these row decoder circuits discharge the selected word lines to a low potential such as, for instance, ground potential, while the selected bit lines are pulled to a high positive voltage such as, for instance, 12 volts.

Recent advances in semiconductor memory technology have led to the development of a PMOS floating gate memory cell, as disclosed in the commonly owned co-pending U.S. patent application Ser. No. 08/557,589 referenced above and incorporated herein by reference. Referring to FIG. 1, that co-pending application discloses in one embodiment a P-channel memory cell 10 having a channel region 12 extending between P+ source 14 and P+ drain 16 regions formed in an N-well 18 of a P-type substrate 20. A floating gate 22 is insulated from the surface of N-well 18 by a thin tunneling oxide layer 24. A control gate 26 overlies floating gate 22.

Cell 10 may be programmed by hot electron injection. Referring to FIG. 1, P+ source 14 is at a floating potential, N-well 18 is grounded, approximately 10.5 V is applied to control gate 26, and approximately −6 V is applied to P+ drain 16. These potentials result in electrons tunneling from P+ drain 16 into floating gate 22, thereby charging floating gate 22.

Cell 10 may be erased by applying a positive voltage to P+ source 14, P+ drain 16, and N− well 18, while applying a negative voltage such as, for instance, −11 volts to control gate 26 via the selected word line. Electrons tunnel from floating gate 22 across the entire length of tunneling oxide layer 24 into channel 12, source 14, and drain 16, thereby returning the threshold voltage of cell 10 to that of its erased state.

Cell 10 may be selected for reading by grounding the selected word line, i.e., control gate 26, and coupling a positive read voltage such as, for instance $V_{cc}$, to P+ source 14 and N− well 18. A voltage less than $V_{cc}$ is applied to P+ drain 16. Thus, selected cell 10 will conduct a channel current only if cell 10 is programmed, i.e., only if charge is stored in floating gate 22.

The operation of a memory array containing a plurality of PMOS memory cells such as cell 10 presents challenges very different from those presented by conventional memory arrays that employ NMOS transistors as memory cells. Indeed, conventional row decoders circuits may not operate properly with a memory array containing PMOS memory cells such as cell 10. For instance, since the gate potential of a PMOS transistor device must remain slightly below the potential of its P+ source region in order to conduct current, the bit lines to which the P+ drains of associated PMOS memory cells 10 are coupled must be discharged towards ground potential and the P+ sources of the PMOS memory cells must be charged to a high positive potential prior to read operations.

For instance, during read operations of memory arrays containing NMOS memory cells, selected word lines are maintained at a positive potential while un-selected word lines are maintained at a low potential. Conversely, during read operations of such a PMOS memory array, the selected word lines are maintained at a low positive voltage level while the un-selected word lines are maintained at a higher positive voltage level. Further, the row decoder circuit associated with such a PMOS memory array should be able to provide a negative high voltage to the selected word lines during erase operations.

SUMMARY

In accordance with the present invention, a row decoder circuit is provided which may selectively provide suitable programming, reading, and erasing voltages to an associated memory array employing PMOS floating gate transistors as memory cells. During programming, row decoder circuits in accordance with the present invention provide a high positive voltage to the selected word lines of the associated memory array and maintain the un-selected word lines at ground potential. During reading, the row decoder circuits discharge the selected word lines to ground potential and maintain the un-selected word lines at a predetermined positive potential such as, for instance, the supply voltage Vcc. In some embodiments, during erasing the row decoder circuits charge the selected word lines to a high negative voltage. The row decoder circuit includes isolation means to electrically isolate the word lines of the associated memory array from undesirable potentials during programming, reading, and erasing operations.

DETAILED DESCRIPTION

Figure 1:
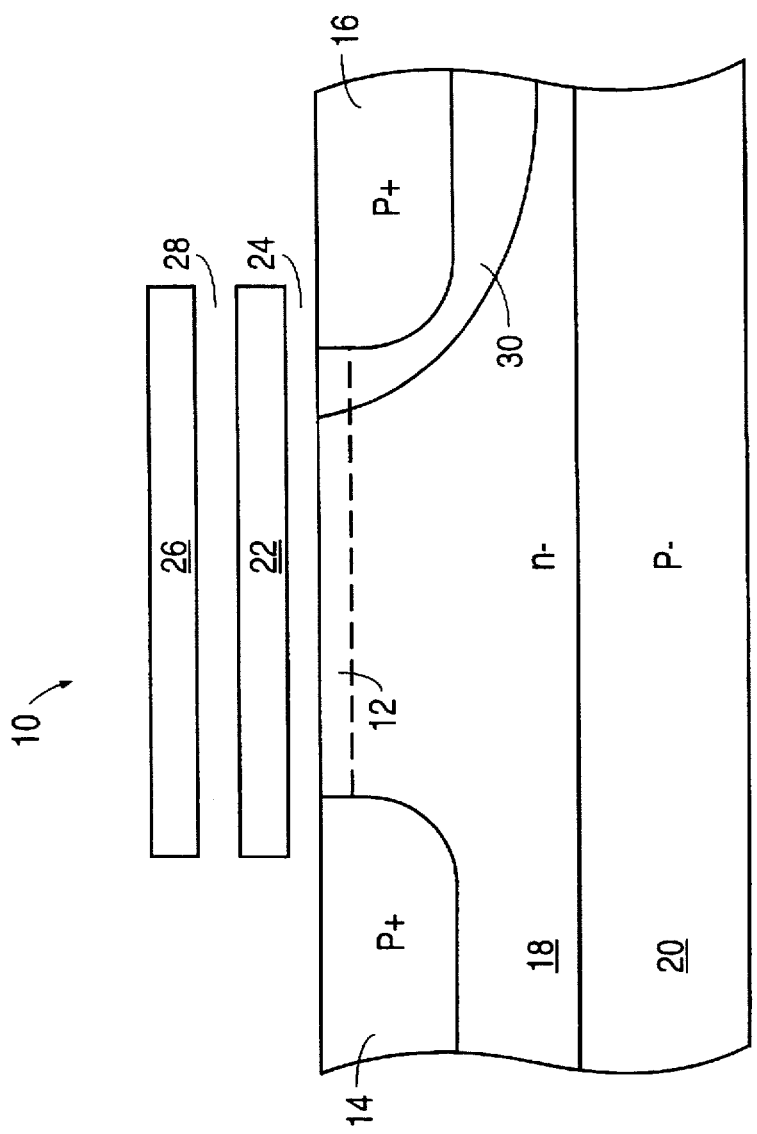
FIG. 1 is a cross-sectional view of a PMOS floating-gate memory cell in accordance with the above-mentioned corresponding U.S. patent application Ser. No. 08/557,589.
Figure 2:
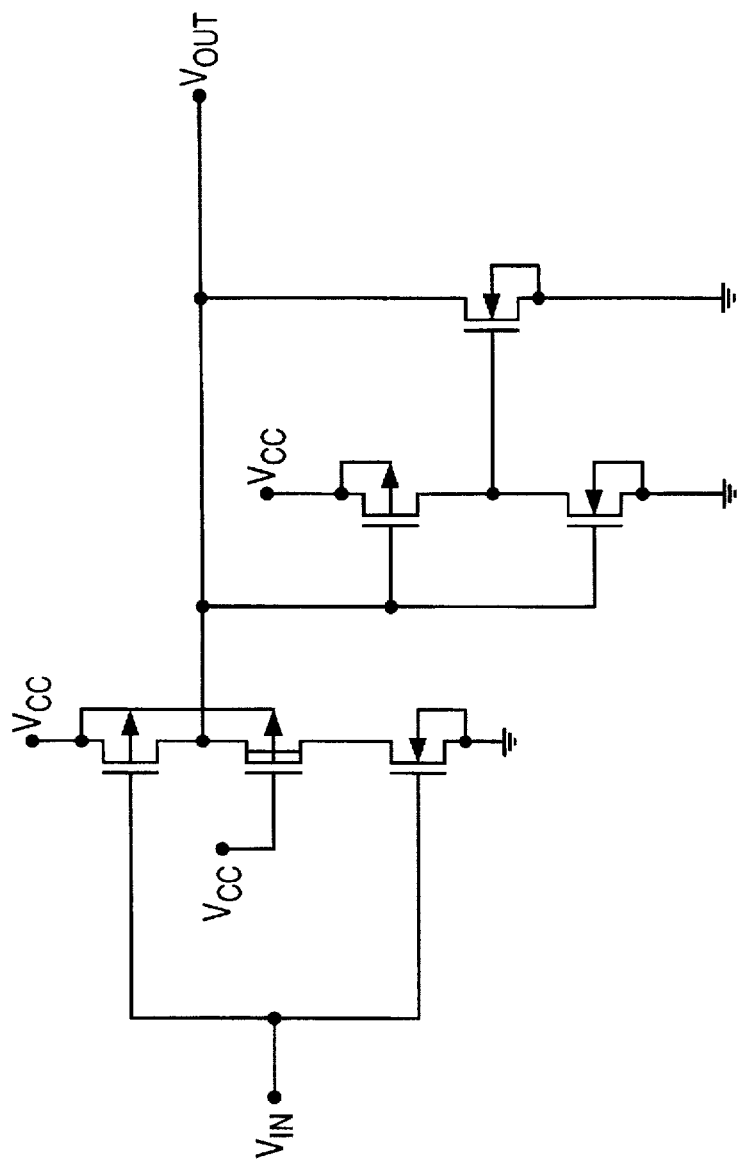
FIG. 2 is a schematic diagram of a conventional row decoder circuit.
Figure 3:
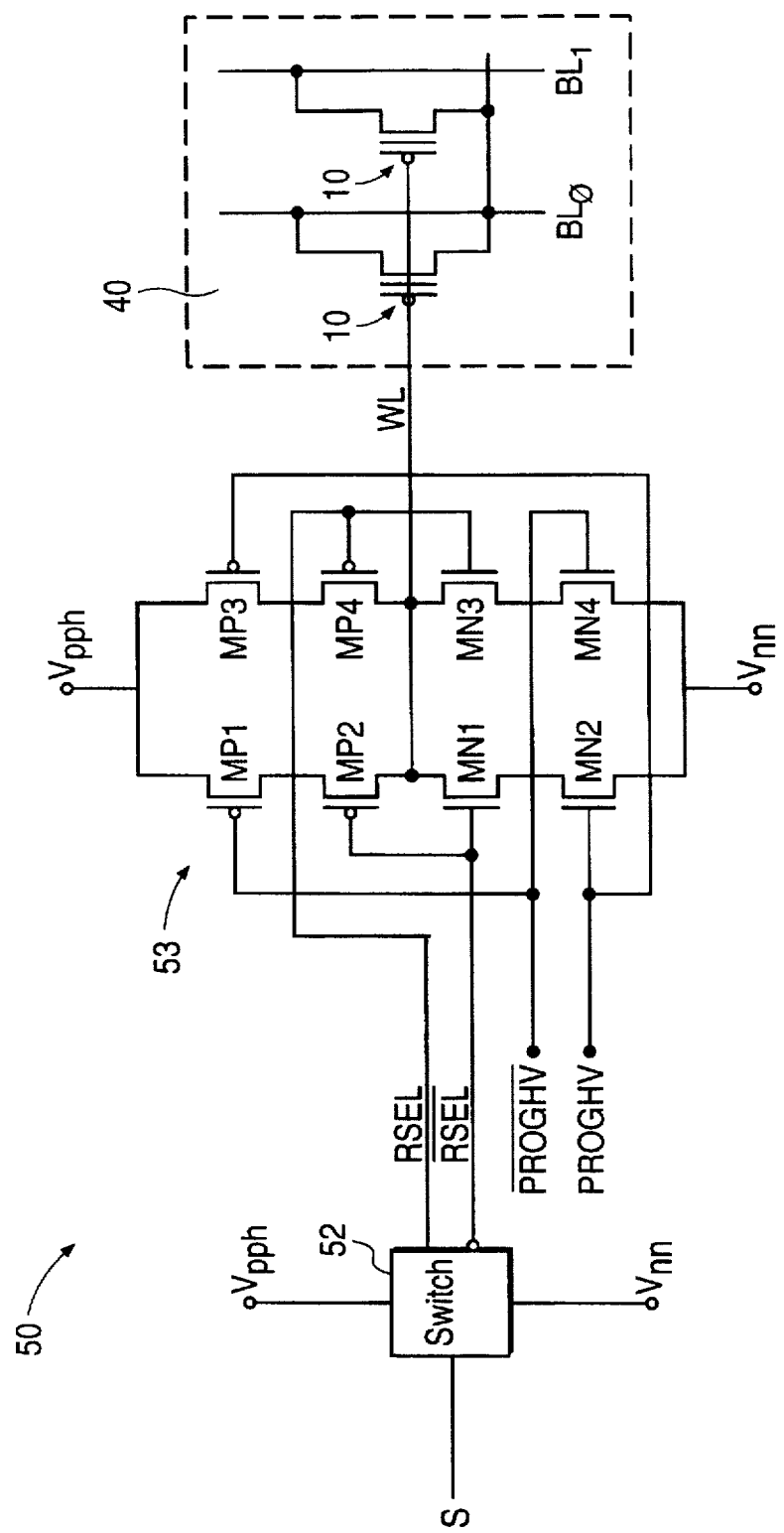
FIG. 3 is a schematic diagram of a row decoder circuit in accordance with one embodiment of the present invention.

Referring to FIG. 3, embodiments of the present invention are discussed below in the context of a memory array 40 employing as memory cells PMOS floating gate transistors of the type discussed above and shown in FIG. 1. Although not shown in FIG. 3 for simplicity, in actual embodiments memory array 40 will usually have numerous word lines WL each of which being connected to an associated one of the row decoder circuits in accordance with the present invention. It is to be understood, however, that embodiments in accordance with this invention may be used with arrays which employ other types of PMOS memory cells, such as, for instance single-poly PMOS memory cells disclosed in commonly owned and co-pending U.S. patent application Ser. No. 08/744,699 entitled "PMOS SINGLE-POLY NON-VOLATILE MEMORY STRUCTURE", filed Oct. 31, 1996 and bearing attorney docket No. M-4268 US, fuses, antifuses, programmable logic devices, or in conjunction with any circuit which requires the selective application of various potentials as described below.

As mentioned above, the various program, read, and erase operations of a memory array employing PMOS memory cells 10 are different from those of conventional memory arrays containing NMOS flash or NMOS EEPROM cells and, accordingly, present unique challenges for the row decoder circuits associated with PMOS memory cells. For instance, during read operations, the selected word lines WL of memory array 40 should be maintained at a low voltage level and the un-selected word lines should be maintained at a high voltage level such as, for instance, the supply voltage $V_{cc}$ which, in some embodiments, may be approximately 3 volts, although in other embodiments higher or lower supply voltages may be used. Moreover, when reading a selected one of PMOS cells 10 within array 40, the selected bit lines $BL_x$ are discharged to a low potential such as, for instance, ground potential, while the un-selected word lines are grounded. During such read operations, the sources of the selected ones of memory cells 10 are held at a high potential such as, for instance, the supply voltage $V_{cc}$. If the selected one of cells 10 is programmed, that one of cells 10 will conduct a channel current and thereby charge its associated selected bit line to a higher potential. If, on the other hand, the selected one of cells 10 is not programmed, that selected one of cells 10 will not conduct a channel current and its associated selected bit line will remain at the low "discharged" potential. An associated sense amplifier (not shown) monitors the resultant voltage on the selected bit line $BL_x$ and thereby determines the binary state of cell 10 selected for reading.

Row decoder circuit 50 is coupled to receive a select signal S indicating whether the word line WL to which row decoder circuit 50 is connected is being selected for a particular operation. Select signal S may be generated in a well known manner in response to a plurality of row address signals indicative of the address of the one of cells 10 selected for a particular operation (not shown). A high-voltage switch 52 has a first terminal connected to a regulated voltage line $V_{pph}$ and a second terminal connected to a negative voltage line $V_{nn}$. Line $V_{pph}$ may during some operations be charged to a high positive potential using a conventional charge pump and a conventional voltage regulator and during other operations may be electrically coupled to the supply voltage $V_{cc}$. Similarly, negative voltage line $V_{nn}$ may during some operations be charged to a negative voltage using, for instance, a negative charge pump such as the type disclosed in the above-mentioned commonly owned U.S. patent application Ser. No. 08/639,280, or other suitable means, and may during other operations be coupled to ground potential.

In response to the logic state of select signal S, switch 52 alternatively couples its output terminals 52a and 52b, upon which appear select signal RSEL and its complementary signal $\overline{\text{RSEL}}$, respectively, to lines $V_{pph}$ and $V_{nn}$. Thus, when select signal S is in a first logic state, output terminal 52a is pulled to $V_{pph}$, thereby pulling signal RSEL high to the potential on line $V_{pph}$, and output terminal 52b is pulled to $V_{nn}$, thereby pulling signal $\overline{\text{RSEL}}$ low to the potential on line $V_{nn}$. If, on the other hand, select signal S is in a second logic state, signal RSEL is pulled to the potential on line $V_{nn}$, and signal $\overline{\text{RSEL}}$ is pulled high to the potential on line $V_{pph}$.

Figure 4:
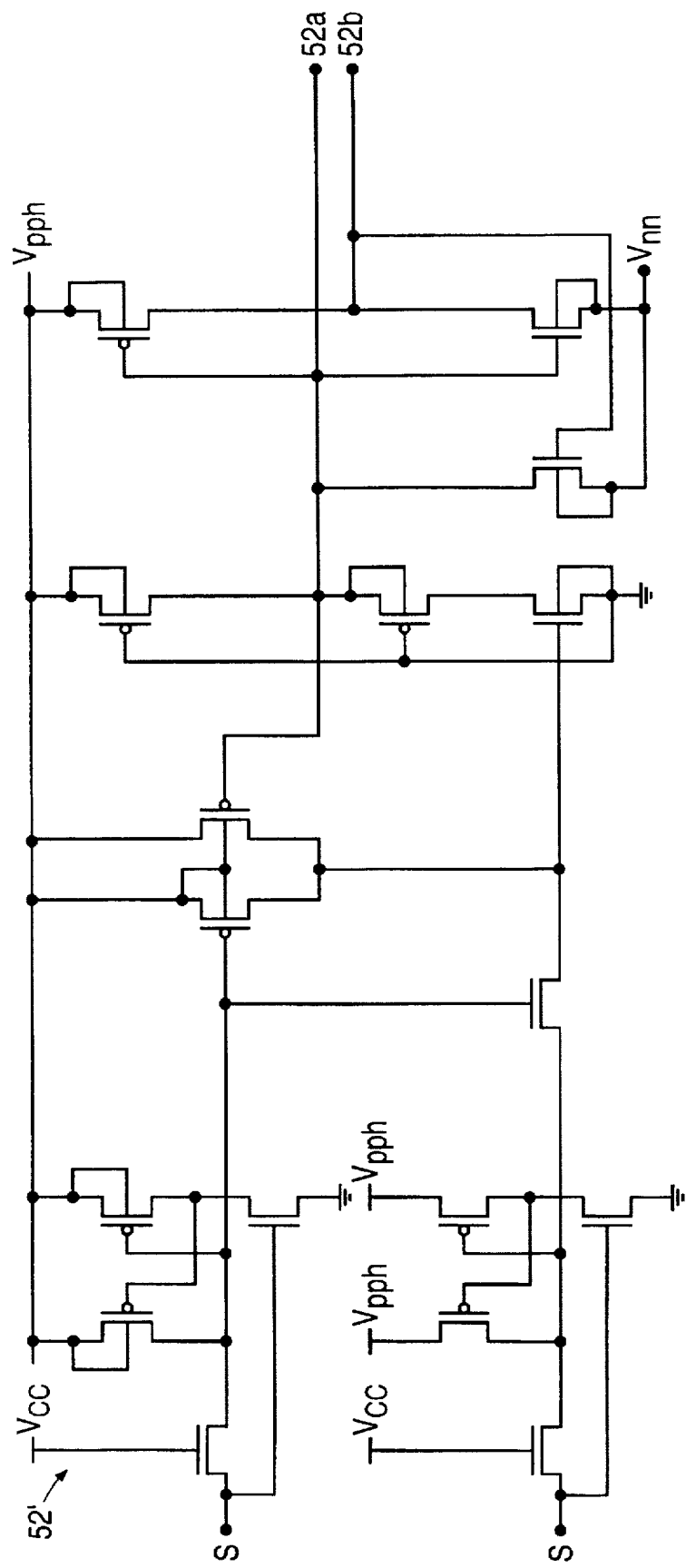
FIG. 4 is a schematic diagram of a high-voltage switch employed in one embodiment of the row decoder circuit of FIG. 3.
Figure 5:
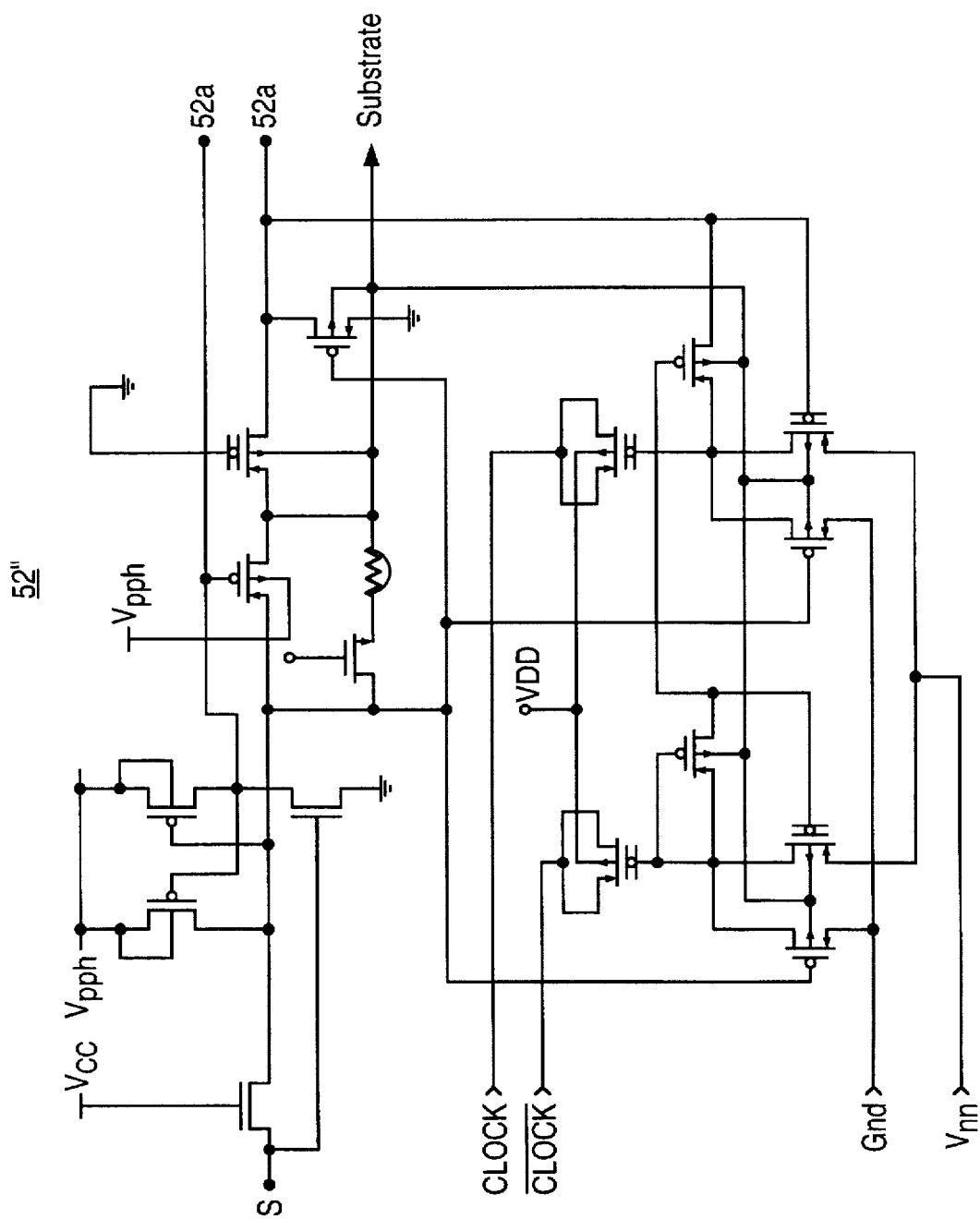
FIG. 5 is a schematic diagram of a high-voltage switch employed in another embodiment of the row decoder circuit of FIG. 3.

In those embodiments in which a triple well process technology is employed for fabrication, switch 52 may be of the type shown in FIG. 4 as switch 52'. Switch 52' converts the logic level of select signal S to either the high potential on line $V_{pph}$ or to the low potential on line $V_{nn}$. In those embodiments where a triple well technology is not employed during fabrication, switch 52 may be of the type illustrated in FIG. 5 as switch 52".

Circuit 50 includes a driver stage 53 having first and second legs of series connected transistors. The first leg includes PMOS transistors MP1, MP2 and NMOS transistors MN1, MN2 series connected between regulated voltage line $V_{pph}$ and negative voltage line $V_{nn}$. The second leg includes PMOS transistors MP3, MP4 and NMOS transistors MN3, MN4 series connected between lines $V_{pph}$ and $V_{nn}$.

Signal RSEL is provided to the gates of transistors MN3 and MP4, while signal $\overline{\text{RSEL}}$ is provided to the gates of transistors MN1 and MP2. A first control signal PROGHV is coupled to the gates of transistors MN2 and MP3, and a second control signal $\overline{\text{PROGHV}}$ is coupled to the gates of transistors MN4 and MP1. As will be more fully explained below, control signals PROGHV and $\overline{\text{PROGHV}}$ are global signals which may be generated using any suitable logic circuit and determine which of the two legs formed by transistors MP1, MP2, MN1, and MN2 and by transistors MP3, MP4, MN3, and MN4, respectively is enabled. The respective drains of transistors MP2, MP4 and the respective drains of transistors MN1, MN3 are commonly coupled at an output terminal 54 of circuit 50. Output terminal 54 is connected to a word line WL of associated memory array 40. The bulks of PMOS transistors MP1–MP4 are each electrically coupled to line $V_{pph}$, and the bulks of transistors MN1–MN4 are each electrically coupled to line $V_{nn}$.

PROGRAMMING OPERATIONS

During programming operations, the voltage on line $V_{pph}$ is maintained at approximately 10.5 volts and the voltage on line $V_{nn}$ is maintained at ground potential. Note, however, that in other embodiments lines $V_{pph}$ and $V_{nn}$ may be charged to other suitable voltage levels during programming. Signal PROGHV is maintained at a voltage level equal to the voltage on line $V_{pph}$, i.e., 10.5 volts, while signal $\overline{PROGHV}$ is maintained at a voltage level equal to the voltage on line $V_{nn}$, i.e., ground potential. The high positive voltage (10.5 volts) of signal PROGHV turns on transistor MN2 and turns off transistor MP3. The zero voltage of signal $\overline{PROGHV}$ turns transistor MN4 off and turns transistor MP1 on. Thus, during programming operations the leg formed by transistors MP1, MP2, MN1, and MN2 is enabled and the leg formed by transistors MP3, MP4, MN3, and MN4 is disabled by control signals PROGHV and $\overline{PROGHV}$, respectively. Note that the N-well within which cells 10 are formed is maintained at ground potential during programming.

When it is desired to select word line WL during programming, select signal S is maintained in a first logic state such that switch 52 electrically connects its output terminal 52a to voltage line $V_{pph}$ and electrically connects its output terminal 52b to negative voltage line $V_{nn}$. As a result, signal RSEL is at a high positive potential, e.g., 10.5 volts, and complementary signal $\overline{RSEL}$ is at approximately ground potential. The high voltage of signal RSEL turns on transistor MN3 and turns off transistor MP4, while the zero volt level of complimentary signal $\overline{RSEL}$ turns off transistor MN1 and turns on transistor MP2. Since transistors MP1 and MP2 are both conducting, word line WL is pulled to the high positive voltage on line $V_{pph}$, e.g., 10.5 volts. In this manner, a programming voltage $V_p$ of approximately 10.5 volts is provided to the control gates of memory cells 10 coupled to word line WL so as to facilitate the programming of those cells 10 via, for instance, band-to-band induced electron tunneling as disclosed in the above-referenced co-pending U.S. patent application Ser. No. 08/557,589. Transistors MN1 and MN4 are non-conductive and thereby provide electrical isolation between word line WL and line $V_{nn}$ when word line WL is selected during programming operations.

When word line WL is not selected, select signal S is in a second logic state such that switch 52 electrically connects its output terminal 52a to voltage line $V_{nn}$ and electrically connects its output terminal 52b to voltage line $V_{pph}$. As a result, signal RSEL has a zero voltage level ($V_{nn}$) and complementary signal $\overline{RSEL}$ has a voltage level of approximately 10.5 volts ($V_{pph}$). Thus, signal RSEL turns off transistor MN3 and turns on transistor MP4, while signal $\overline{RSEL}$ turns off transistor MP2 and turns on transistor MN1. The conductive states of transistors MN1 and MN2 create a low impedance current path between word line WL and line $V_{nn}$, thereby pulling the un-selected word line WL to ground potential during programming. In this manner, electrons are precluded from tunneling into the floating gates of those of cells 10 coupled to un-selected word line WL. Note that since transistor MP2 is non-conducting, word line WL is, when not selected, electrically isolated from line $V_{pph}$.

READING OPERATIONS

During reading operations of array 40, line $V_{pph}$ is maintained at the supply voltage $V_{cc}$ and line $V_{nn}$ is maintained at ground potential. Note, however, that in other embodiments lines $V_{pph}$ and $V_{nn}$ may be charged to other suitable voltage levels during reading. The voltage level of signal PROGHV is maintained at the voltage of line $V_{nn}$, i.e., ground potential, and the voltage level of signal $\overline{PROGHV}$ is maintained at the voltage of line $V_{pph}$, i.e., $V_{cc}$. Thus, signal PROGHV turns off transistor MN2 and turns on transistor MP3, while signal $\overline{PROGHV}$ turns on transistor MN4 and turns off transistor MP1. Accordingly, the leg formed by transistors MP1, MP2, MN1, and MN2 is disabled and the leg formed by transistors MP3, MP4, MN3, and MN4 is enabled.

If it is desired to select word line WL for reading, select signal S is in the first logic state. In response thereto, switch 52 electrically connects its output terminal 52a to line $V_{pph}$ and electrically connects its output terminal 52b to line $V_{nn}$. Thus, signal RSEL is of the voltage level $V_{cc}$ and thereby turns off transistor MP4 and turns on transistor MN3. Signal $\overline{RSEL}$ has a zero voltage and thereby turns on transistor MP2 and turns off transistor MN1. Transistors MN3 and MN4 create a low impedance path between word line WL and line $V_{nn}$ and thus pull the selected word line WL to ground potential. If the PMOS cell 10 selected for reading is in a programmed state, the selected cell 10 will conduct a channel current which, in turn, is detected by an appropriate sensing circuit (not shown for simplicity). Transistors MP4 and MP1 are non-conducting and thereby electrically isolate word line WL from the positive voltage $V_{cc}$ on line $V_{pph}$.

Where word line WL is not selected during reading operations, select signal S will be in the second logic state, thereby causing switch 52 to electrically couple its output terminal 52a to line $V_{nn}$ and to electrically couple its output terminal 52b to line $V_{pph}$. Since signal RSEL is at ground potential and signal $\overline{RSEL}$ is at $V_{cc}$, transistors MP4 and MN1 turn on and transistors MP2 and MN3 turn off. Transistors MP3 and MP4 create a low impedance current path between the un-selected word line WL and line $V_{pph}$, thereby pulling the un-selected word line WL to $V_{cc}$ and thus ensuring that cells 10 coupled to un-selected word line WL do not conduct a channel current. Transistors MN2 and MN3 are non-conducting and thus provide electrical isolation between the un-selected word line WL and line $V_{nn}$, i.e., ground potential.

ERASING OPERATIONS

During erasing operations, the voltage on line $V_{pph}$ is maintained at approximately 7.5 volts and the voltage on line $V_{nn}$ is maintained at approximately −11 volts. Note, however, that in other embodiments lines $V_{pph}$ and $V_{nn}$ may be charged to other suitable voltage levels during erasing. Signal PROGHV is maintained at −11 volts, i.e., at the potential of line $V_{nn}$, and signal $\overline{PROGHV}$ is maintained at approximately 7.5 volts, i.e., at the potential of line $V_{pph}$. Signal PROGHV turns off transistor MN2 and turns on transistor MP3, while signal $\overline{PROGHV}$ turns on transistor MN4 and turns off transistor MP1. Accordingly, the leg formed by transistors MP1, MP2, MN1, and MN2 is disabled and the leg formed by transistors MP3, MP4, MN3, and MN4 is enabled.

If it is desired to select word line WL for erasing, select signal S is in the first logic state. As discussed above, switch 52 electrically couples its output terminal 52a to line $V_{pph}$ and electrically couples its output terminal 52b to line $V_{nn}$. Thus, the voltage level of signal RSEL is at approximately 7.5 volts, thereby turning on transistor MN3 and turning off transistor MP4, and the voltage level of signal $\overline{RSEL}$ is at approximately −11 volts, thereby turning on transistor MP2 and turning off transistor MN1. Transistors MN3 and MN4 electrically couple the selected word line WL to line $V_{nn}$ and thereby provide approximately −11 volts to the control gates of selected cells 10 so as to facilitate the erasing of such selected cells 10 via, for instance, electron tunneling. Note that non-conducting transistors MP4 and MP1 provide electrical isolation between the selected word line WL and line $V_{pph}$.

If it is desired to not select word line WL for erasing, select signal S is in the second logic state. As discussed above, switch 52 electrically couples its output terminal 52a to line $V_{nn}$ and electrically couples its output terminal 52b to line $V_{pph}$. Thus, the voltage level of signal RSEL is at approximately −11 volts, thereby turning off transistor MN3 and turning on transistor MP4, and the voltage level of signal $\overline{RSEL}$ is at approximately 7.5 volts, thereby turning off transistor MP2 and turning on transistor MN1. Transistors MP3 and MP4 electrically couple the selected word line WL to line $V_{pph}$ and thereby provide approximately 7.5 volts to the control gates of un-selected cells 10 so as to prevent the tunneling of electrons from the floating gates of such un-selected cells 10. Non-conducting transistors MN3 and MN2 provide electrical isolation between the selected word line WL and line $V_{nn}$.

The operation of row decoder circuit 50 allows for the unique voltages required on word line WL during programming, reading, and erasing operations upon PMOS memory cells such as, for instance, cells 10. Referring again to FIG. 3, during programming operations the selected word line is maintained at a high potential, e.g., 10.5 volts, while the un-selected word line WL is maintained at a low voltage, e.g., ground. During reading and erasing operations, however, the selected word line WL is maintained at a low potential, e.g., ground for reading and −11 volts for erasing, and the un-selected word line WL is maintained at a high potential, e.g., $V_{cc}$ for reading and 7.5 volts for erasing. Accordingly, circuit 50 selectively enables one of its two current path legs. The leg formed by transistors MP1, MP2, MN1, and MN2 is enabled during programming operations to couple word line WL to either 10.5 volts or ground potential, while the leg formed of transistors MP3, MP4, MN3, and MN4 is enabled during reading and erasing operations, thereby coupling word line WL to either $V_{cc}$ or ground during reading and coupling word line WL to either 10.5 volts or −11 volts during erasing. In this manner, transistors MN1–MN4 and MP1–MP4 are maintained in a proper conductive state so as to couple word line WL to one of lines $V_{pph}$ and $V_{nn}$ while simultaneously isolating word line WL from the other of lines $V_{pph}$ and $V_{nn}$.

While particular embodiments of the present invention have been shown and described, it will be apparent to those skilled in the art that changes and modifications may be made without departing from this invention in its broader aspects and, therefore, the appended claims are to encompass within their scope all such changes and modifications as fall within the true spirit and scope of this invention. For instance, the particular voltages given in the description above are merely illustrative of the present invention; actual embodiments may employ voltages other than those given above.

We claim:

1. A row decoder circuit for selectively providing reading, programming, and erasing voltages to a word line of reading, programming, and erasing operations of an associated memory array employing PMOS floating gate transistors as memory cells, said row decoder circuit comprising:

a first transistor having a first terminal coupled to said word line and a second terminal coupled to receive a first potential on a first voltage line and having a gate coupled to receive a select control signal, said first transistor pulling said word line to said first potential in response to said select control signal indicating said word line is selected for one of said operations and electrically isolating said word line in response to said select control signal indicating said word line is not selected for one of said operations;

a second transistor having a first terminal coupled to said word line and second terminal coupled to receive a second potential on a second voltage line and having a gate coupled to receive said select control signal, said second transistor pulling said word line to said second potential in response to said select control signal indicating said word line is not selected for one of said operations and electrically isolating said word line in response to said select control signal indicating said word line is selected for one of said operations;

a third transistor having a first terminal coupled to said word line and a second terminal coupled to receive said first potential on said first voltage line and having a gate coupled to receive a select control signal, said third transistor pulling said word line to said first potential in response to said select control signal indicating said word line is selected for one of said operations and electrically isolating said word line in response to said select control signal indicating said word line is not selected for one of said operations;

a fourth transistor having a first terminal coupled to said word line and second terminal coupled to receive said second potential on said second voltage line and having a gate coupled to receive said select control signal, said fourth transistor pulling said word line to said second potential in response to said select control signal indicating said word line is not selected for one of said operations and electrically isolating said word line in response to said select control signal indicating said word line is selected for one of said operations; and a select means having a first portion coupled between said first voltage line and said second terminals of said first and third transistors and having a second portion coupled between said second voltage line and said second terminals of said second and fourth transistors, said select means enabling the selective coupling of said first and second transistors to said first and second voltage lines, respectively, and preventing the selective coupling of said third and fourth transistors to said first and second voltage lines, respectively, during said programming operations, said select means preventing the selective coupling of said first and second transistors to said first and second voltage lines, respectively, and enabling the selective coupling of said third and fourth transistors to said first and second voltage lines, respectively, during said reading and erasing operations.

2. The circuit of claim 1, wherein during said programming operations said first potential is approximately 10.5 volts and second potential is approximately ground potential.

3. The circuit of claim 1, wherein during said reading operations said first potential is approximately equal to a supply voltage and said second potential is approximately ground potential.

4. The circuit of claim 1, wherein during said erasing operations said first potential is approximately −11 volts and said second potential is approximately 7.5 volts.

5. The circuit of claim 1, wherein said first portion of said select means comprises a fifth transistor coupled between said first voltage line and said second terminal of said first transistor and having a gate coupled to receive a select signal and a sixth transistor coupled between said second voltage line and said second terminal of said second transistor and having a gate coupled to receive said select signal, wherein said second portion of said select means comprises a seventh transistor coupled between said first voltage line and said second terminal of said third transistor and having a gate coupled to receive said select signal and an eighth transistor coupled between said second voltage line and said second terminal of said fourth transistor and having a gate coupled to receive said select signal.

6. The circuit of claim 1, further comprising a switch having a first and second terminals coupled to said first and second voltage lines, respectively, a control terminal coupled to receive a select signal, and an output terminal for providing said select control signal, said switch providing said first potential as said select control signal in response to said select signal indicating said word line is selected for one of said operations and providing said second potential as said select control signal in response to said select signal indicating said word line is not selected for one of said operations.

7. A row decoder circuit for selectively providing reading, programming, and erasing voltages to a word line of an associated memory array employing PMOS floating gate transistors as memory cells, said row decoder circuit comprising:

a first switching means for selectively providing either a first potential on a first voltage line or a second potential on a second voltage line to said word line in response to a select control signal;

a second switching means for selectively providing either said first voltage or said second voltage to said word line in response to a complement of said select control signal; and enabling means having a first portion coupled between said first voltage line and respective first ports of said first and second switching means and having a second portion coupled between said second voltage line and respective second ports of said first and second switching means, wherein during said programming operations said enabling means allows said first switching means to selectively provide either said first or second potential to said word line while precluding said second switching means from providing either said first or second potential to said word line, wherein during said reading and erasing operations said enabling means allows said second switching means to selectively provide either said first or second potential to said word line while precluding said first switching means from providing either said first or second potential to said word line.

8. The circuit of claim 7, wherein:
said first switching means comprises:

a first transistor having a first terminal coupled to said word line, a second terminal coupled to receive said first potential, and a control terminal coupled to receive said select control signal; and a second transistor having a first terminal coupled to said word line, a second terminal coupled to receive said second potential, and a control terminal coupled to receive said select control signal;

and
wherein said second switching means comprises:

a third transistor having a first terminal coupled to said word line, a second terminal coupled to receive said first potential, and a control terminal coupled to receive said complement of said select control signal; and a fourth transistor having a first terminal coupled to said word line, a second terminal coupled to receive said second potential, and a control terminal coupled to receive said complement of said select control signal.

9. The circuit of claim 8, wherein:
said first portion of said enabling means comprises:

a fifth transistor having a first terminal coupled to said first voltage line, a second transistor coupled to said second terminal of said first transistor, and a control terminal coupled to receive a control signal; and a sixth transistor having a first terminal coupled to said first voltage line, a second transistor coupled to said second terminal of said third transistor, and a control terminal coupled to receive said control signal;

and
said second portion of said enabling means comprises:

a seventh transistor having a first terminal coupled to said second voltage line, a second transistor coupled to said second terminal of said second transistor, and a control terminal coupled to receive a control signal; and an eighth transistor having a first terminal coupled to said second voltage line, a second transistor coupled to said second terminal of said fourth transistor, and a control terminal coupled to receive a control signal.

10. A method for selectively providing programming, reading, and erasing voltages to a word line of an associated memory array during programming, reading, and erasing operations, respectively, said memory array employing PMOS floating gate devices as memory elements, said method comprising:

determining which of said programming, reading, or erasing operations is to be performed;

providing a first potential on a first voltage line, the magnitude of said first potential being determined by the determining step;

providing a second potential on a second voltage line, the magnitude of said second potential being determined by the determining step;

determining whether said word line is selected for one of said operations;

enabling a first switch to selectively provide said first and second potentials to said word line if said programming operation is to be performed, said first switch coupling said word line to one of said first and second potentials while isolating said word line from the other of said first and second potentials in response to the second determining step; and enabling a second switch to selectively provide said first and second potentials to said word line if either of said reading and erasing operations is to be performed, said first switch coupling said word line to one of said first and second potentials while isolating said word line from the other of said first and second potentials in response to the second determining step.

11. The method of claim 10, wherein said first and second potentials are approximately 10.5 volts and ground potential, respectively, during said programming operations.

12. The method of claim 10, wherein said first and second potentials are approximately a supply voltage and ground potential, respectively, during said reading operations.

13. The method of claim 10, wherein said first and second potentials are approximately 7.5 volts and −11.5 volts, respectively, during said erasing operations.

* * * * *

UNITED STATES PATENT AND TRADEMARK OFFICE
CERTIFICATE OF CORRECTION

PATENT NO. : 5,796,656  
DATED : August 18, 1998  
INVENTOR(S) : Kowshik, et al.

Page 1 of 2

It is certified that error appears in the above-identified patent and that said Letters Patent is hereby corrected as shown below:

In Column 2, line 65, please replace "Vcc" with --$V_{cc}$--.

In Column 4, line 62, please replace "respectively" with --respectively,--.

In Column 7, line 64, Claim 1, please replace "word line of" with --word line during--.

In Column 8, line 23, Claim 1, please replace "receive a select" with --receive said select--.

In Column 8, line 64, Claim 4, please replace "-11 volts" with --7.5 volts--.

In Column 8, line 65, Claim 4, please replace "7.5 volts" with -- -11 volts--.

In Column 9, line 14, Claim 6, please replace "having a first" with --having first--.

In Column 9, line 34, Claim 7, please replace "first voltage or said second voltage" with --first potential or said second potential--.

In Column 10, line 10, Claim 9, please replace "a second transistor" with --a second terminal--.

In Column 10, line 14, Claim 9, please replace "a second transistor" with --a second terminal--.

In Column 10, line 16, Claim 9, please replace "said control signal" with --said complement of said control signal--.

UNITED STATES PATENT AND TRADEMARK OFFICE
CERTIFICATE OF CORRECTION

PATENT NO. : 5,796,656
DATED : August 18, 1998
INVENTOR(S) : Kowshik, et al.

It is certified that error appears in the above-identified patent and that said Letters Patent is hereby corrected as shown below:

In Column 10, line 20, Claim 9, please replace "a second transistor" with --a second terminal--.

In Column 10, line 22, Claim 9, please replace "a control signal" with --said complement of said control signal--.

In Column 10, line 24, Claim 9, please replace "a second transistor" with --a second terminal--.

In Column 10, line 26, Claim 9, please replace "a control signal" with --said control signal--.

Signed and Sealed this

Fourth Day of May, 1999

Q. TODD DICKINSON

*Attest:*

*Attesting Officer*  *Acting Commissioner of Patents and Trademarks*